United States Patent [19]

Kobayashi et al.

[11] Patent Number: 4,570,153

[45] Date of Patent: Feb. 11, 1986

[54] SIGNAL CONVERSION APPARATUS FOR USE IN PCM SIGNAL PROCESSING SYSTEM

[75] Inventors: Masaharu Kobayashi; Takao Arai; Tsutomu Noda, all of Yokohama, Japan

[73] Assignee: Hitachi, Ltd., Tokyo, Japan

[21] Appl. No.: 621,744

[22] Filed: Jun. 18, 1984

[30] Foreign Application Priority Data

Jun. 17, 1983 [JP] Japan ................................ 58-107694

[51] Int. Cl.[4] .............................................. H04J 3/06
[52] U.S. Cl. ...................... 340/347 AD; 340/347 SH; 340/347 DA; 370/119; 328/151
[58] Field of Search ................ 307/352, 353; 328/151; 340/347 SH; 370/112, 119

[56] References Cited

U.S. PATENT DOCUMENTS

| 1,772,165 | 8/1930 | Taylor et al. | 370/119 |
| 4,005,276 | 1/1977 | Abramson et al. | 370/119 |
| 4,271,508 | 6/1981 | Schenk | 370/112 |
| 4,477,900 | 10/1984 | Gruenberg | 370/112 |

Primary Examiner—Bernard Roskoski

Attorney, Agent, or Firm—Antonelli, Terry & Wands

[57] ABSTRACT

A signal conversion apparatus for use in a PCM signal processing system in which a series of multi-bit digital signals is produced through sampling and quantization of a multi-channel analog signal. The series of multi-bit digital signals includes groups of multi-bit digital signals being representative of respective analog signal portions constituting the multi-channel analog signal. The apparatus comprises a translating section for producing substitutional multi-bit digital signals from at least one of the groups of digital signals corresponding to at least one analog signal portion, which substitutional digital signals represent amplitudes of the one analog signal portion at sampling points different from those at which the one analog signal was sampled to provide the one group of digital signals. The substitutional digital signals are substituted, in the translating section, for the one group of the digital signals to produce a corresponding group of sampling point-shifted multi-bit digital signals. The resulting PCM multi-bit digital signals are acceptable by digital-to-analog conversion processor requiring PCM digital signals generated through sampling at shifted or different sampling points as compared with the above-mentioned series of digital signals.

9 Claims, 27 Drawing Figures

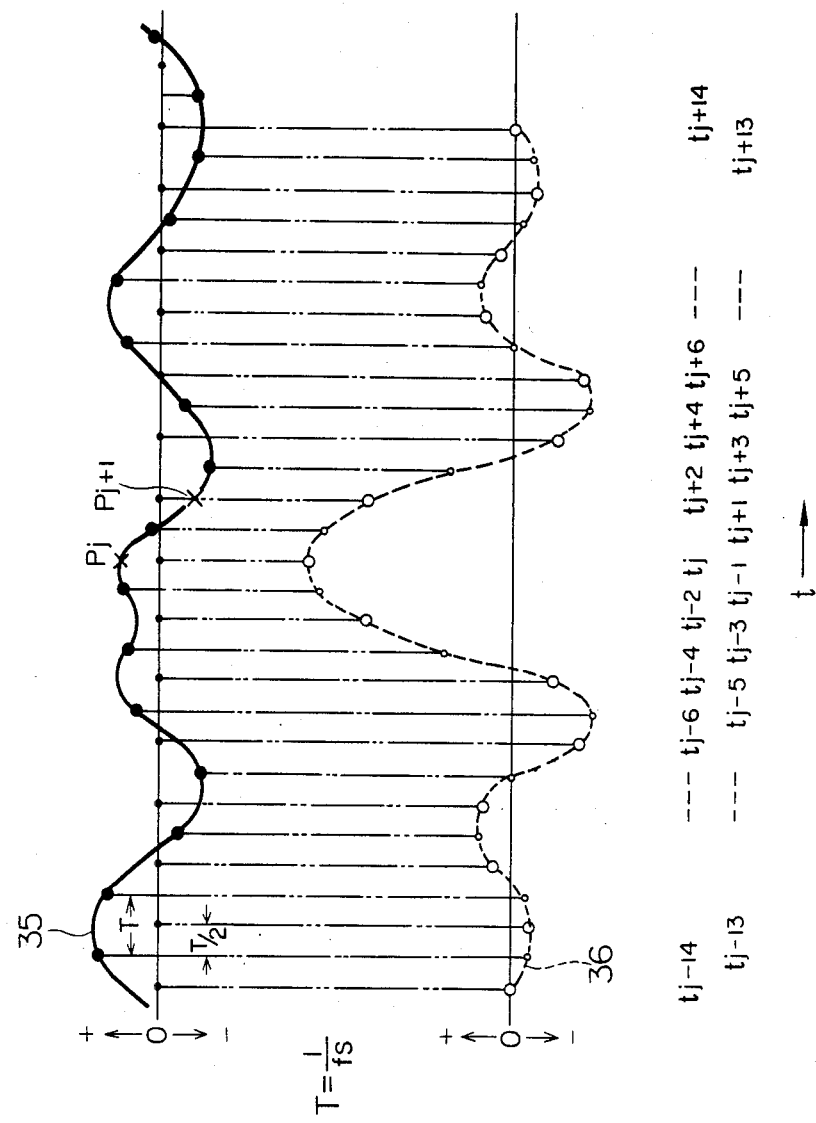

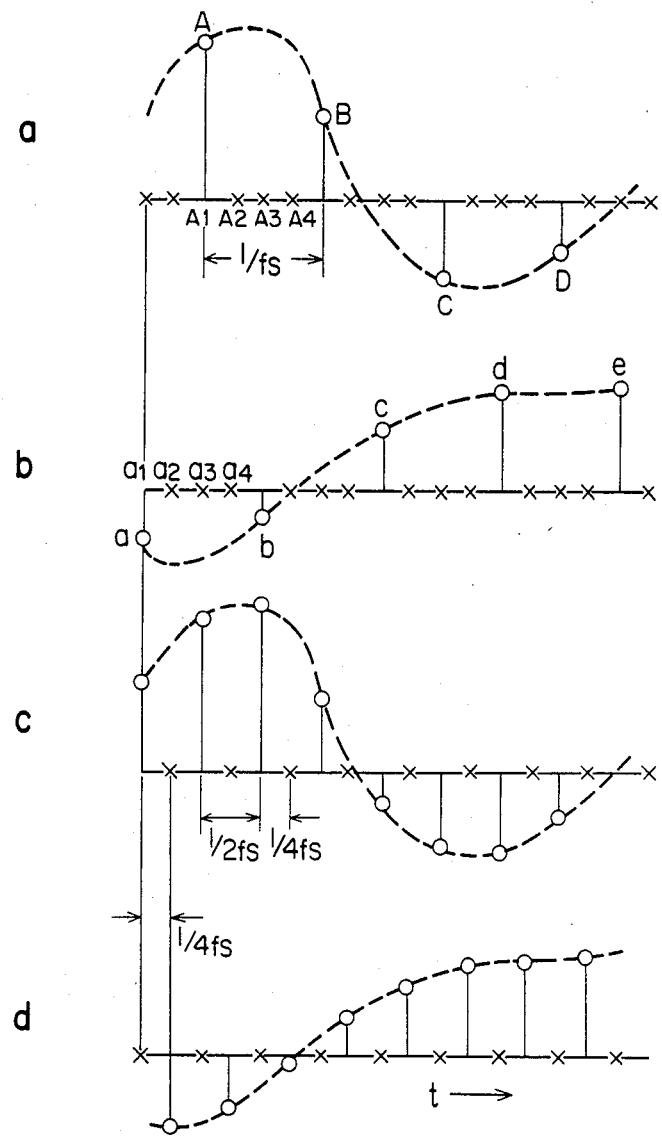

SIGNAL CONVERSION APPARATUS FOR USE IN PCM SIGNAL PROCESSING SYSTEM

BACKGROUND OF THE INVENTION

This application is related to U.S. patent application Ser. No. 578,787 filed Feb. 10, 1984 and entitled "DIGITAL-TO-ANALOG CONVERTER DEVICE" by Masaharu Kobayashi and five others and assigned to the assignee of this application.

This invention relates to signal conversion apparatus for use in a PCM signal processing system and more particularly to a PCM signal conversion apparatus particularly useful for conversion between simultaneous sampling PCM signal data and alternate sampling PCM signal data.

In the conventional PCM signal format for a two channel system, an L-channel analog signal and an R-channel analog signal may be sampled at simultaneous time points (simultaneous sampling) or otherwise may be alternate time points (alternate sampling). And, most of the PCM signal processing systems are of the type receiving alternate sampling PCM signals for simplification of their circuit construction.

Therefore, for a connection or coupling between processing systems adapted for reception of simultaneous sampling PCM signals and for reception of alternate sampling PCM signals, it will be necessary to "convert" sampling time points for the PCM digital signals, thereby matching the sampling points for PCM digital signals communicated between the processing systems.

Further, a similar problem will arise in connection with a PCM broadcasting from a broadcast satellite using the SHF band and the reception of the broadcast by a receiver on the ground. This satellite broadcasting system is being put into practice in Japan. Namely, the broadcasting from the satellite is to be performed in two PCM transmission modes: the four channel transmission with a sampling frequency of 32 KHz, and the two channel transmission with a sampling frequency of 20 KHz. And, in either one of transmission modes, the sampling time points for the PCM transmission signals may not be always concurrent with those for the PCM signals which receivers on the ground will accept.

SUMMARY OF THE INVENTION

An object of the present invention is to provide a PCM signal conversion apparatus capable of sampling point conversion.

Practically, the present invention may be applied to, for example, VTR adapted for recording and reproducing PCM signals, compact disc players, digital audio tape-recorders and the above-mentioned SHF satellite broadcasting and reception.

A PCM (pulse code modulation) signal contains a plurality of groups of multi-bit digital signals constituting a series of multi-bit digital signals produced by sampling and quantizing a multi-channel analog signal including a plurality of analog signal portions on separate channels. Each group of multi-bit digital signals is representative of one analog signal portion. The PCM signal conversion apparatus of the present invention includes means for producing from, one or more groups of multi-bit digital signals representative of at least one of the analog signal portions on separate channels, substitutional multi-bit digital signals representative of the amplitudes of the at least one analog signal portion at sampling points different from sampling points with which the one or more multi-bit digital signal groups were produced.

In accordance with one aspect of the present invention, use is made of a digital filter for generating data values at sampling points different from sampling points for a portion of an input PCM digital signal, so that a conversion is effected between an alternate sampling PCM digital signal and a simultaneous sampling PCM digital signal. Thereby, a processing system for dealing with an alternate sampling PCM signal (or a simultaneous sampling PCM signal) will be able to accept a simultaneous sampling PCM signal (or an alternate sampling PCM signal) delivered from another system or transmitted from a broadcasting satellite.

BRIEF DESCRIPTION OF THE DRAWINGS

In the accompanying drawings:

FIG. 12B is a diagram for illustrating storage data in a coefficient ROM in a sampling time converting circuit which may be used in the present invention;

FIG. 15 is a diagram illustrating a dual function of sampling point conversion and sampling frequency conversion of a digital filter.

DESCRIPTION OF THE PREFERRED EMBODIMENTS

First, reference will be made to FIGS. 1A to 2B to describe A/D and D/A converting sections used in PCM signal processing systems.

Figure 1A:
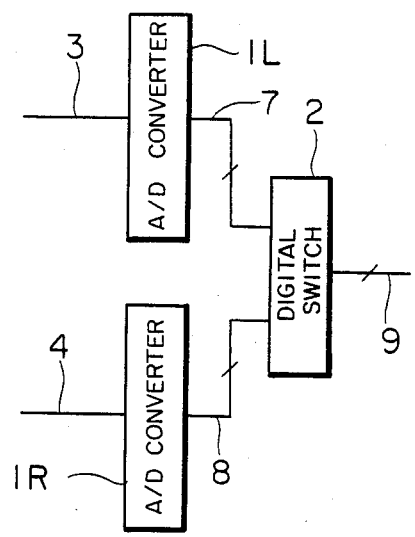
FIGS. 1A and 1B are block diagrams of a general structure of an A/D converting section.

FIG. 1A is a block diagram of an A/D converting section for dealing with a two-channel analog signal including an L-channel analog signal 3 and an R-channel analog signal 4 to generate a simultaneous sampling PCM digital signal. An L-channel analog signal 3 is converted into a digital signal 7 in an A/D converter 1L while an R-channel analog signal 4 is converted into a digital signal 8 in an A/D converter 1R. And, these digital signals 7 and 8 are multiplexed by a digital switch 2 to produce a simultaneous sampling PCM signal 9.

Figure 1B:
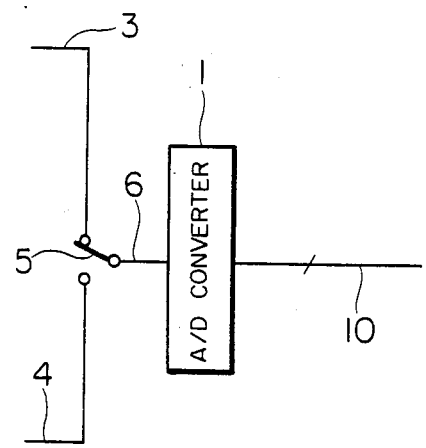

FIG. 1B is a block diagram of another A/D converting section for dealing with a two channel analog signal including an L-channel analog signal 3 and an R-channel analog signal 4 to generate an alternate sampling PCM digital signal. These analog signals 3 and 4 are multiplexed by an analog switch 5 and converted into an alternate sampling PCM signal 10 in a single A/D converter 1.

Figure 2A:
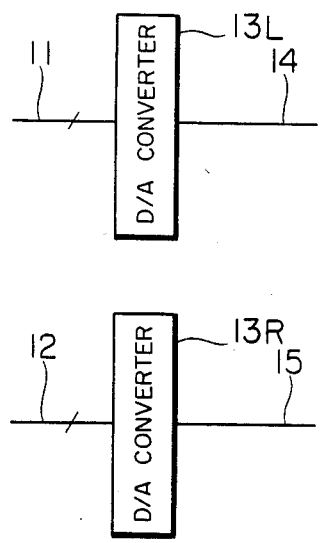
FIGS. 2A and 2B are block diagrams of a general structure of a D/A converting section.

FIG. 2A is a block diagram of a D/A converting section for dealing with a simultaneous sampling PCM digital signal representative of an L-channel analog signal and an R-channel analog signal to reproduce the analog signals. An L-channel digital signal 11 is converted into an analog signal 14 in a D/A converter 13L while an R-channel digital signal 12 is converted into an analog signal 15 in another D/A converter 13R.

Figure 2B:
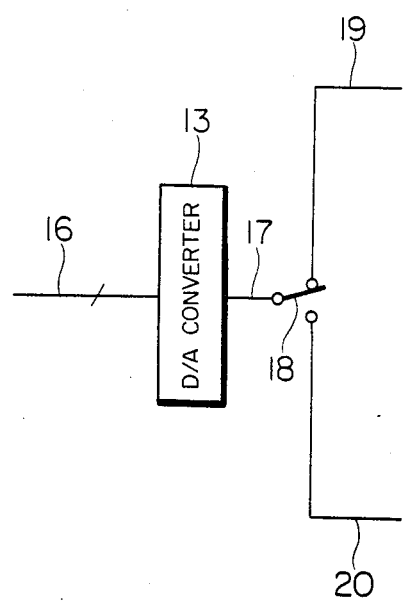

FIG. 2B is a block diagram of another D/A converting section for dealing with an alternate sampling PCM digital signal representative of an L-channel analog signal and an R-channel analog signal to reproduce the analog signals. The alternate sampling PCM digital signal 16 is converted into an analog signal 17 in a single D/A converter 13, which is separated by an analog switch 18 into an L-channel analog signal 19 and an R-channel analog signal 20.

In a usual PCM signal processing system, when an input analog signal is a multi-channel analog signal, which for example includes two analog signal portions on separate channels, the system may be in such a structure as adapted for reception of an alternate sampling PCM digital signals. This is because the system has only to include a single A/D converter and a single D/A converter as far as conversion between analog and digital signals is concerned. Thus, it will be necessary to effect conversion between simultaneous sampling data and alternate sampling data.

A shift of sampling data on a time-base axis in place of the above-mentioned signal processing of sampling point conversion would not result in a satisfactory matching between PCM signal processing systems dealing with simultaneous sampling and alternate sampling PCM digital signals, respectively.

The above fact will be explained referring to FIGS. 3A and 3B.

Figure 3A:
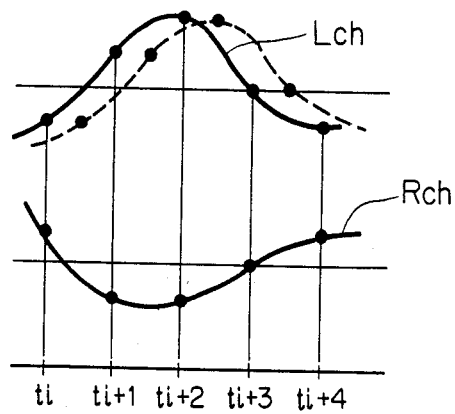
FIGS. 3A and 3B are graphs for explaining simultaneous sampling and alternate sampling.

FIG. 3A shows two-channel, L-channel and R-channel analog signals and their simultaneous sampling, in which black point marks (.) indicate values at the sampling points and a dashed line indicates a waveform of an L-channel digital signal by shifting the simultaneous sampling data by one-half of the sampling period on the time-base axis, whereby alternate sampling data for the L- and R-channel analog signals are generated.

Figure 3B:
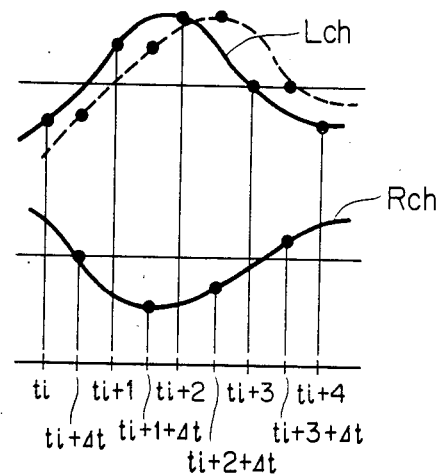

FIG. 3B shows two-channel, L-channel and R-channel analog signals and their alternate sampling, in which black point marks (.) indicate values at the sampling points and a dashed line indicates a waveform when alternate sampling data for the L- and R-channel analog signals are generated by the similar shift of the sampling data by the one-half of the sampling period.

As can be seen from FIGS. 3A and 3B, the shifted data for the L-channel analog signals (indicated by dashed lines) would be different from the original data therefor (indicated by solid lines), which means correct reproduction of the original signals is impossible.

Hereinafter, some embodiments of this invention will be explained referring to FIGS. 4A to 5B.

Figure 4A:
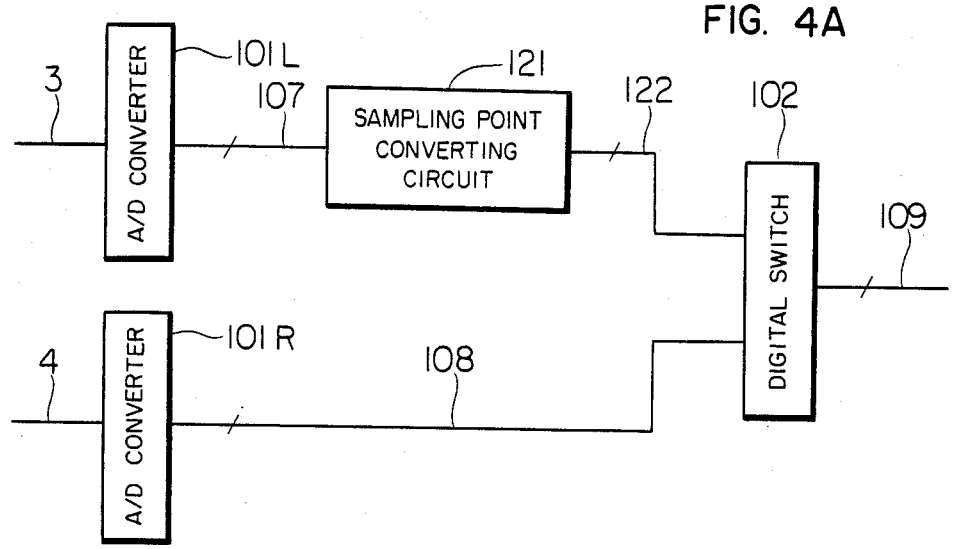
FIGS. 4A to 4C are block diagrams showing some embodiments of the present invention.
Figure 4B:
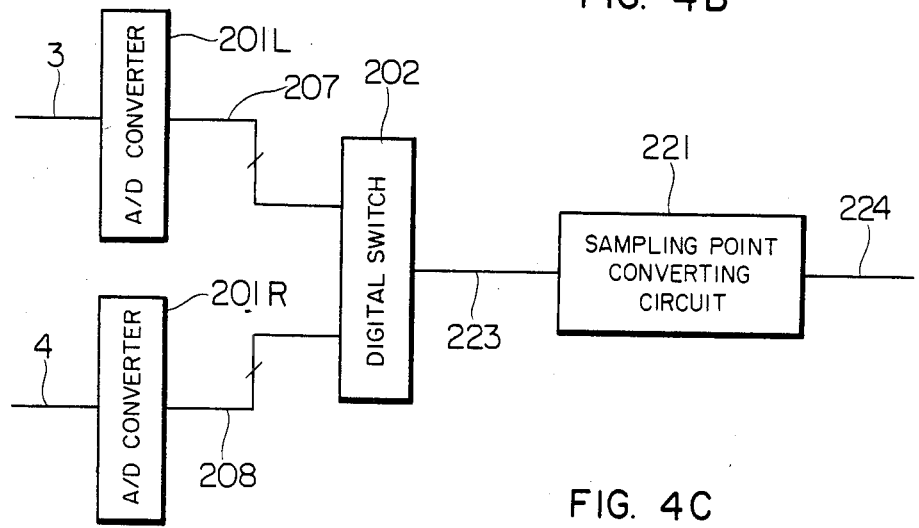
Figure 4C:
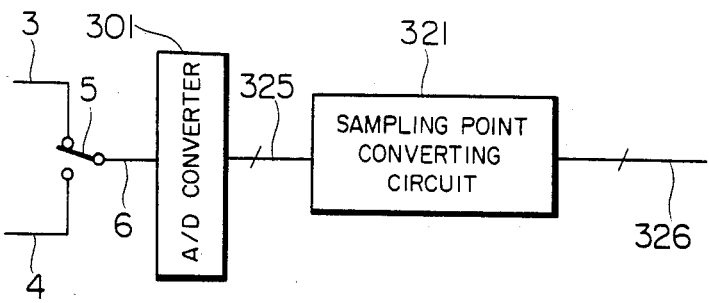

FIGS. 4A and 4B show circuit structures for generating from two channel analog signals into groups of PCM multi-bit digital signals through simultaneous sampling of the analog signals and converting the digital signal groups into a series of alternate sampling PCM digital signals. FIG. 4C shows a circuit structure for generating from two channel analog signals PCM multi-bit digital signals and converting them into a series of simultaneous sampling PCM digital signals.

Figure 5A:
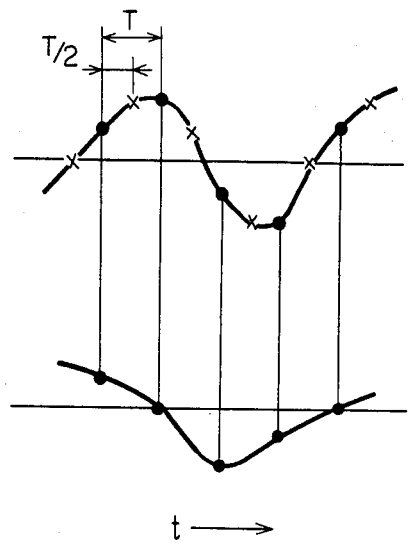
FIGS. 5A and 5B are waveform diagrams for illustrating the functions of the embodiments shown in FIGS. 5A to 5C.
Figure 5B:
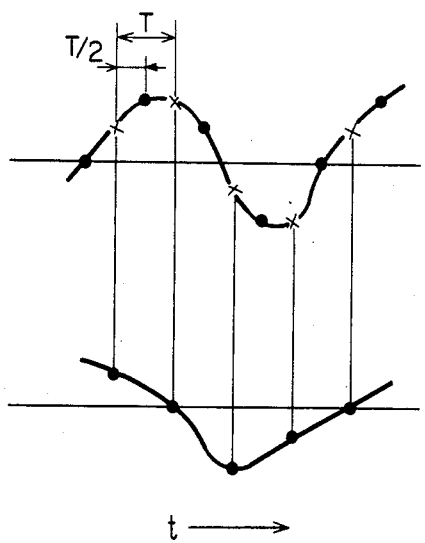

FIG. 5A shows a waveform diagram in the case where alternate sampling data ("x" marks) are obtained from simultaneous sampling data of two channel signals ("." marks). FIG. 5B shows a waveform diagram in the case where alternate sampling data of two channel signals ("x" marks) are converted into simultaneous sampling data ("." marks).

Referring to FIG. 4A, A/D converters 101L and 101R serve to convert an L-channel analog signal (a first analog signal portion) 3 and an R-channel analog signal (a second analog signal portion) 4 into corresponding groups 107 and 108 of multi-bit digital signals through simultaneous sampling of the analog signals. A sampling point converting circuit 121 constitutes translation means which receives the multi-bit digital signal group 107 from the A/D converter 101L and produces a substitutional multi-bit digital signal group 122 representative of the amplitudes of the L-channel analog signal 3 at sampling points different from sampling points with which the digital signal group 107 were generated in the converter 101L. A digital switch 102 receives the output 122 of the converting circuit 121 and the output 108 of the converter 101R and multiplex them to deliver a series of alternate sampling PCM multi-bit digital signals.

More particularly, in FIG. 4A, sampling data of the L-channel digital signal 7 at sampling points different from the sampling points for the digital signal 8, e.g., at points shifted by one-half of the sampling period, by a sampling point converting circuit 121 thereby to provide a substitutional sampling time conversion output 122. This output 122 and the R-channel digital signal 108 are supplied to a digital switch 102 which produces a multiplexed output, i.e., a series of alternate sampling PCM multi-bit digital signals 109.

Referring to FIG. 4B showing another circuit structure, similar to that shown in FIG. 4A, for generating PCM digital signals by simultaneous sampling of analog signals and converting the digital signals into a series of alternate sampling PCM digital signals, A/D converters 201L and 201R serve to convert L-channel and R-channel analog signals 3 and 4 into corresponding groups 207 and 208 of multi-bit digital signals through simultaneous sampling of the analog signals. A digital switch 202 receives the outputs 207 and 208 of the converters 201L and 201R and multiplex them to deliver a series of PCM multi-bit digital signals 223. A sampling time converting circuit 221 is connected with the digital switch 202 through selection means (not shown here) which receives the output 223 of the switch 202 and selects the digital signal group 207 or 208 representative of the L-channel or R-channel analog signal and bypasses the other digital signal group to the output of the circuit 221. This selection means will be described later. The converting circuit 221 constitutes translation means which produces, from the digital signal group 207 or 208, a substitutional multi-bit digital signal group representative of the amplitudes of the analog signal 3 or 4 at sampling points different from sampling points with which the digital signal group 7 or 8 were generated in the converter 201L or 201R.

More particularly, in FIG. 4B, the component or portion of the multiplex output 223 from the switch 202 corresponding to the L-channel or R-channel digital signal 207 or 208 is converted into substitutional sampling data by the sampling point converting circuit 221 with the selection means. That is, the so converted output 224 from the converting circuit 221 is a series of alternate sampling PCM multi-bit digital signal. If, however, the digital signals 207 and 208 are alternate sampling data, they are converted into simultaneous sampling data by the converting circuit 221. Further, also in the case where the digital signals 207 and 208 are applied to the converting circuit 221 directly or through the switch 202, from some other signal sources, similar signal processing of sampling point conversion will be effected.

Referring to FIG. 4C showing a circuit structure for generating a PCM digital signal by alternate sampling of analog signals and converting the digital signals into a series of simultaneous sampling PCM digital signals, an L-channel analog signal and an R-channel analog signal are multiplexed by an analog switch 5 to provide a multiplex output 6, which is converted by a single A/D converter 301 into a series of alternate sampling PCM multi-bit digital signals 325. A sampling point converting circuit 321 is connected with the converter 301 through selection means (not shown here) which receives the output 325 of the converter 301 and selects the signal component representative of the L-channel or R-channel analog signal from the output 325 and bypasses the other signal component to the output of the circuit 321. This selection means will be described later. The converting circuit 321 constitutes translation means which produces, from the digital signal component received from the selection means, a substitutional multi-bit digital signal component representative of the amplitudes of the analog signal 3 or 4 at sampling points different from sampling points with which the digital signal component received from the selection means were generated in the A/D converter 301.

More particularly, in FIG. 4C, simultaneous sampling data 326 are produced by the signal processing in the circuit 321 with the selection means similar to the processing by the converting circuit 221 with the selection means shown in FIG. 4B.

FIG. 5A illustrates the input to and output from the circuit structures shown in FIGS. 4A to 4C by analog waveforms.

FIG. 5A illustrates signal processing of sampling point conversion by the circuit structures shown in FIGS. 4A and 4B. In FIG. 5A, as a result of the sampling point conversion of the simultaneous sampling data of one of the two channel signals indicated by "." marks, substitutional sampling data at sampling points deviated by one-half of the sampling period T, indicated by "x" marks, are produced, whereby alternate sampling data are produced.

FIG. 5B illustrates signal processing of sampling point conversion by the circuit structure shown in FIG. 4C. In FIG. 5B, as a result of the sampling point conversion of the alternate sampling data of one of the two channels indicated by "." marks, substitutional sampling data at sampling points deviated by one-half of the sampling period T, indicated by "x" marks, are produced, whereby simultaneous sampling data are produced.

Although the above explanation has been made of embodiments of the present invention as applied to analog-to-digital conversion in a recording section or modulation section of a PCM signal processing system, the present invention may also be applied to digital-to-analog conversion in a reproducing or demodulation section of such PCM signal processing system.

Figure 6:
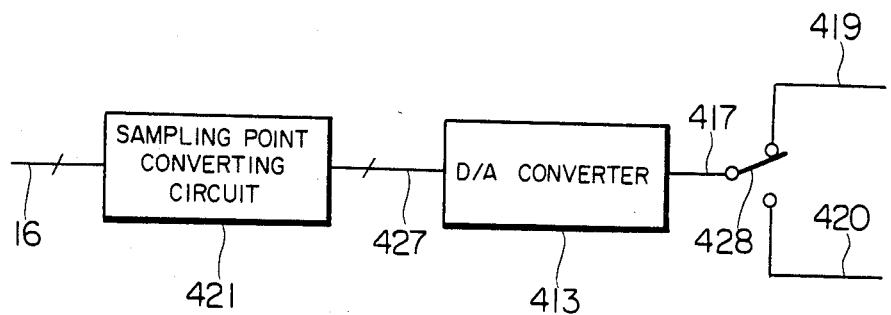
FIGS. 6 and 8 are block diagrams showing other embodiments of the present invention.

FIG. 6 shows a circuit structure for converting a series of PCM multi-bit digital signals produced by simultaneous sampling of multi-channel analog signals (a plurality of analog signal portions, e.g., an L-channel analog signal and an R-channel analog signal) into alternate sampling PCM multi-bit digital signals and reproduce the multi-channel analog signals.

In FIG. 6, a sampling point converting circuit 421 receives a series of simultaneous sampling PCM multi-bit digital signals 16 through selection means (not shown here) so that only the signal component of the signal series 16 representative of the L-channel or R-channel signal is selected and supplied to the converting circuit 421 and the other signal component is bypassed to the output of the converting circuit 421. This selection means will be described later. The converting circuit 421 constitutes translation means which produces, from the signal component received from the selection means, substitutional multi-bit digital signal component representative of the amplitudes of one of the analog signals at sampling points different from sampling points for the signal component received from the selection means by the converting circuit 421. As a result, there appears at the output terminal of the converting circuit 421 a series of alternate sampling PCM multi-bit digital signals 427. A single D/A converter 413 is provided to receive the PCM digital signal series 427 for converting the signal series 427 to an analog signal 417. Reference numeral 418 designates an analog switch for separating the output of the single D/A converter into two-channel analog signals 419 and 420.

Referring further to FIG. 6, simultaneous sampling digital signal series 16 of both L- and R-channels are supplied to the sampling point converting circuit 421 with the selection means. The converting circuit 421 produces substitutional sampling point converted values of either one of the L- and R-channels to provide the signal series output 427. This output 427 is converted to an analog signal 417 in the single D/A converter. This analog signal output is switched to be separated into analog output signals 419 and 420 corresponding to respective channels by the analog switch 428.

Figure 7:
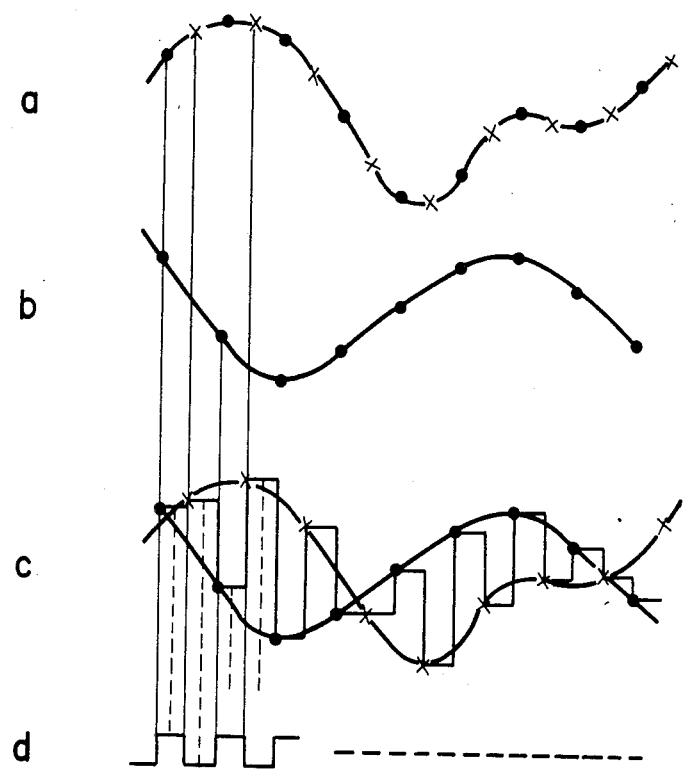
FIGS. 7 and 9 are waveform diagrams for illustrating the functions of the embodiments shown in FIGS. 6 and 8.

The above operation will be explained, referring to the waveform diagram of FIG. 7. FIG. 7 shows at a and b the digital signals of both channels in terms of analog waveforms. The values indicated with "." marks in the drawing represent the values at sampling points. In order to enable a system for dealing with alternate sampling PCM digital signals to process the simultaneous sampling digital signals, one of the signals a and b should be subjected to the sampling point conversion in the converting circuit 421 as indicated by "x" marks at a. Waveform of c shows the analog waveform thereof.

An example of a switching control signal for the switch 428 is shown at d.

Figure 8:
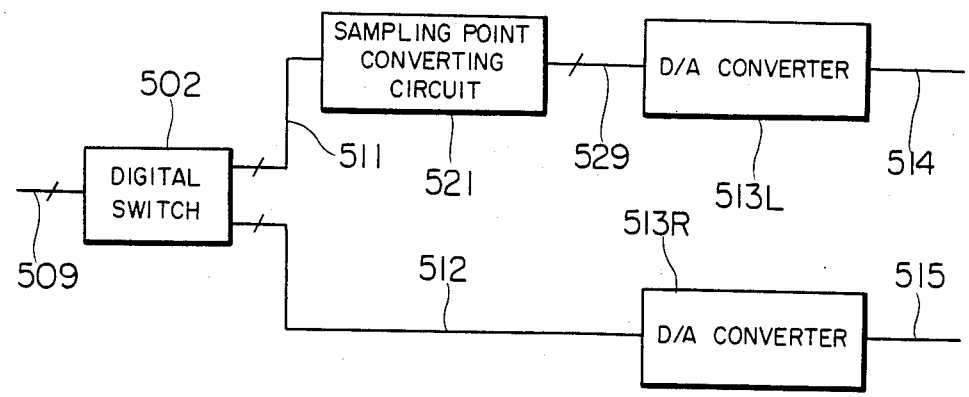

FIG. 8 shows a circuit structure for converting a series of alternate sampling PCM digital signals to groups of simultaneous sampling PCM digital signals and reproducing therefrom multi-channel analog signals. Thus, the PCM digital signal series represents multi-channel analog signals (e.g., two-channel, L-channel and R-channel analog signals).

In FIG. 8, a digital switch 502 receives a series of PCM multi-bit digital signals 509 and separates them into a multi-bit digital signal group 511 and a multi-bit digital signal group 512 representative of an L-channel analog signal and an R-channel analog signal. A sampling time converting circuit 521 is arranged so as to receive, for example, the digital signal group 511. The converting circuit 521 constitutes translation means which produces, from the digital signal group 511, a substitutional group of multi-bit digital signals 529 representative of the amplitudes of the L-channel analog signal at sampling points different from sampling points for the digital signal group 511. A D/A converter 513L receives the output 529 of the converting circuit 529, while another D/A converter 513R receives the multi-bit digital signal group 512, whereby the corresponding analog signals 514 and 515 are reproduced by the converters 513L and 513R.

Referring further to FIG. 8, either one of alternate sampling digital signals 511 and 512 of L- and R-channels, for example, L-channel digital signal, is supplied to the sampling time converting circuit 521 to provide an output 529 which is a result of sampling point conversion of the alternate sampling data to simultaneous sampling data. These digital signals are derived as L- and R-channel analog signals through the D/A converters 513L and 513R.

Figure 9:
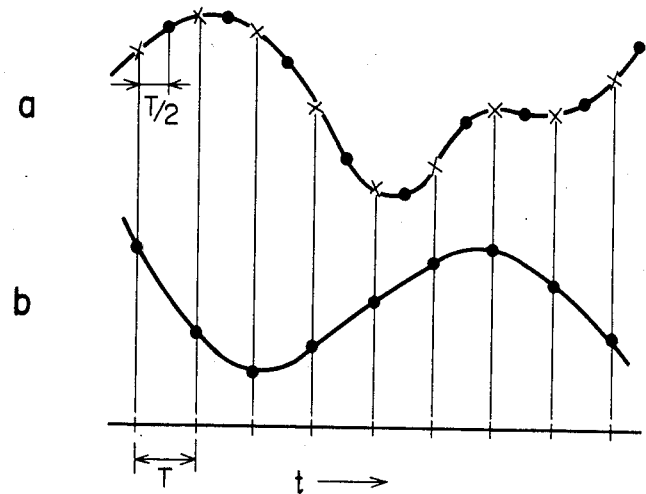

The above operation will be explained referring to the waveform diagram of FIG. 9. FIG. 9 shows at a and b the digital signals of both L- and R-channels in terms of analog waveforms, respectively. In the drawing, the values indicated with "." marks represent the values at sampling points which are alternate sampling values as apparent from the illustration.

The values indicated with "x" marks at a in FIG. 9 are sampling values produced by the sampling point converting circuit 521 and the sampling points thereof coincide with these of the signal of b.

Description will now be made of an example of the structure of the sampling point converting circuit employed in the embodiments shown in FIGS. 4A to 4C, 6 and 8. The converting circuit may typically be constituted by a digital filter, which is capable of producing from PCM digital data having a sampling period T values at the sampling points which are different from those for the former.

Figure 10:
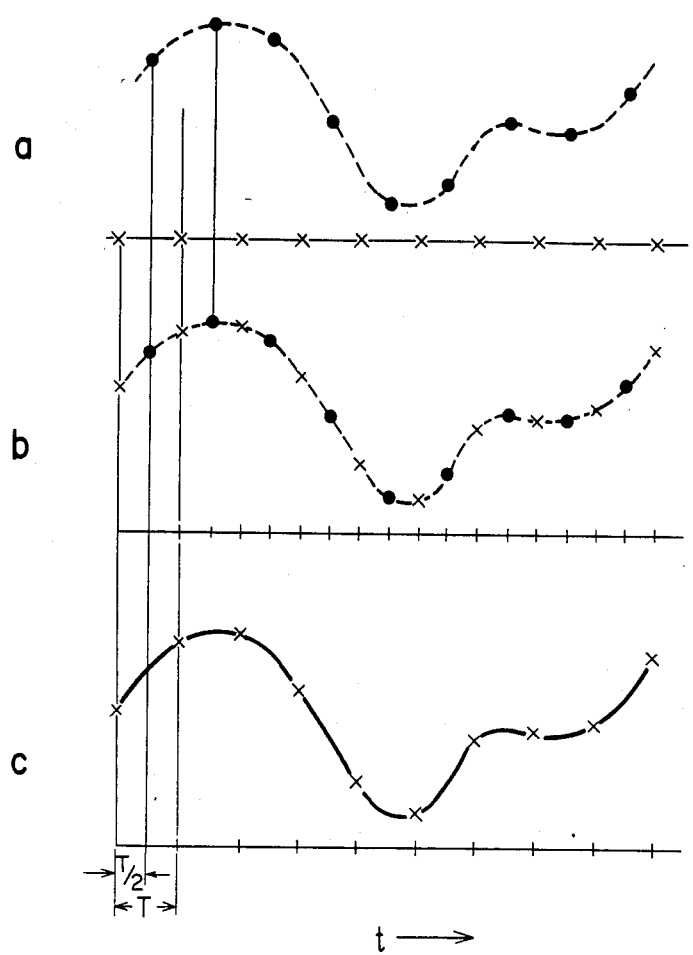
FIGS. 10 and 11 are diagrams for illustrating an operation of a digital filter.

The operation of the converting circuit will be explained referring to FIG. 10. The values with "." marks at a of FIG. 10 are sampling values of an input PCM signal. To these sampling values are added zero value data as the sampling values at the sampling points deviated by T/2 and the sampling values with the sampling period of T/2 as shown at b of FIG. 10 are produced by the digital filter. In the drawing, the values with "x" marks are the sampling values at the sampling points deviated by T/2 from those of the input sampling values.

FIG. 10 shows at c only the sampling data at the sampling points deviated by T/2. Actually, these sampling data may only be produced.

Figure 11:
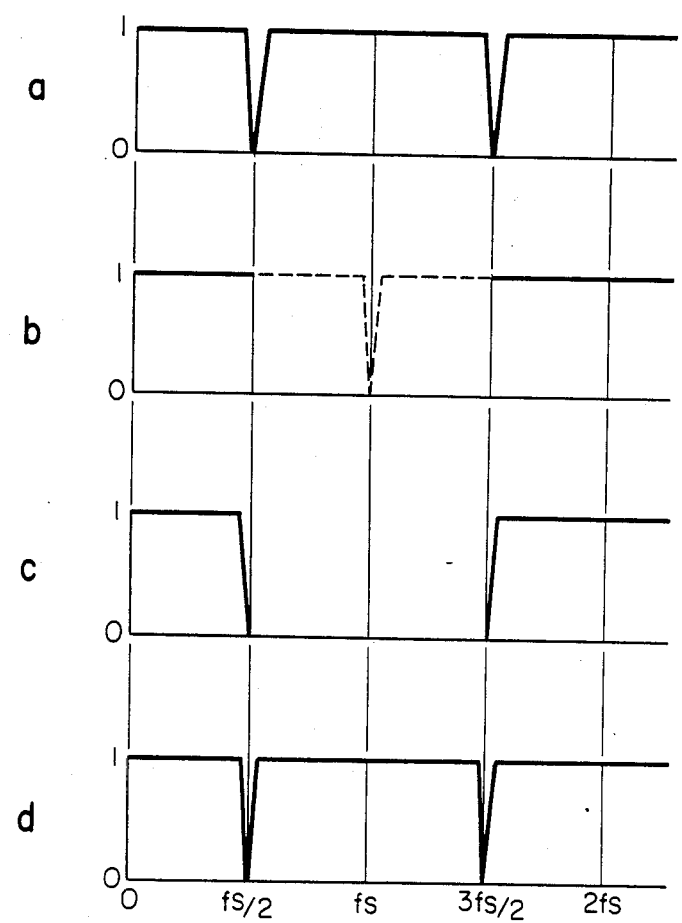

FIG. 11 shows the above operation in terms of frequency spectra. FIG. 11 shows at a frequency spectrum of sampling data having a sampling frequency of $f_s$, at b a frequency spectrum of data to which zero value data are added at the center between adjacent two sampling data to provide a sampling frequency of $2f_s$, at c a frequency spectrum of the sampling data having the sampling frequency of $2f_s$ and low-pass-filtered with a cut-off frequency of $f_s/2$, and at d a frequency spectrum of the input sampling data having been sampling point converted (the sampling frequency unchanged).

The above operations may also be carried out by a transversal filter or several kinds of digital filters.

The digital filters are generally classified into FIR (finite impulse response) filters and IIR (infinite impulse response) filters. An FIR filter will be explained as an example.

The filter provides an output obtained by passing a time sequence of input digital signals through a filter having predetermined filtering characteristics.

Namely, the convolution between the input signals and an impulse response signal provides a filtered output signal.

Figure 12A:
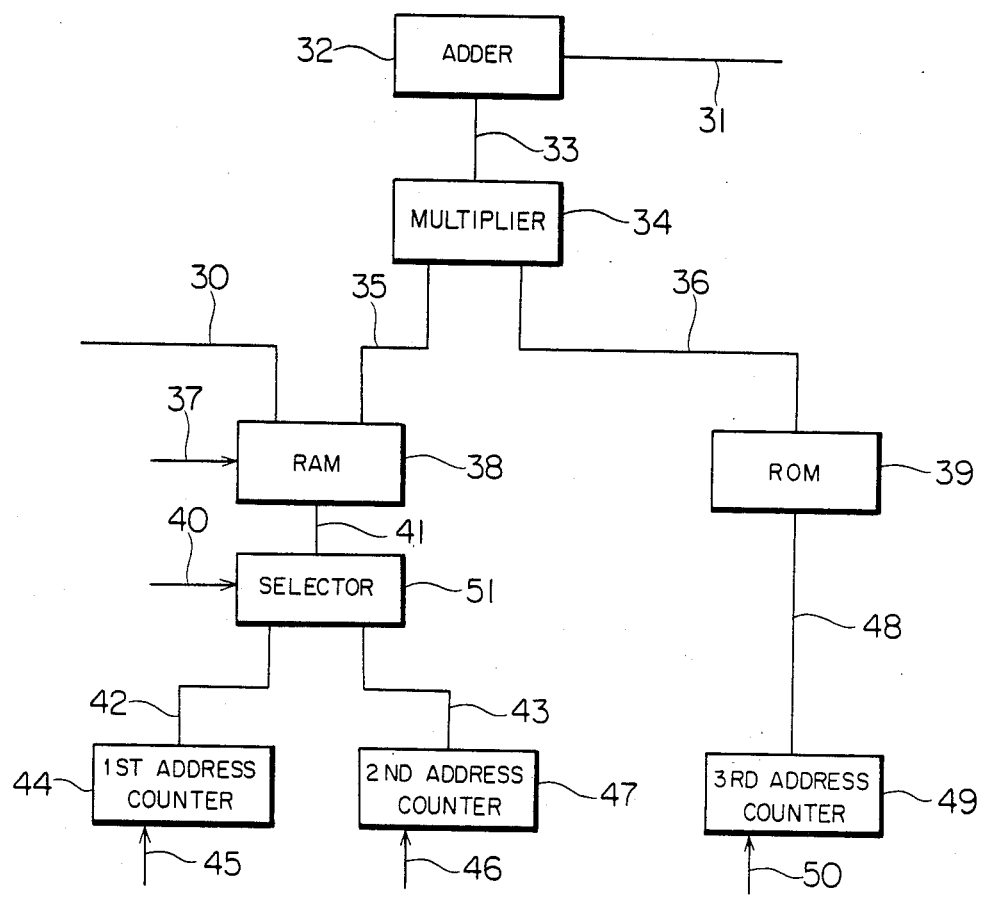
FIG. 12A is a diagram showing an example of a sampling time converting circuit which may be used in the present invention.

An example of the sampling point converting circuit for this purpose is shown in FIG. 12A. As seen from the drawing, input PCM digital signals 30 are stored in a memory (RAM) 38. The signals stored in the memory 38 are successively read out to provide an output 35. This output is multiplied, in a multiplier 34, by the output 36 read out from a coefficient read-only-memory 39 which has stored convolution coefficients. The multiplied outputs are successively added in an adder 32. The output 31 from this adder is a filtered output signal. The memory 38 is address-controlled as follows. The output 42 from a first address counter 44 responsive to a write-clock 45 and the output 43 from a second address counter 47 responsive to a read-clock 46 are applied to a selector 51, which is controlled by a select signal 40. The selected output 41 from the selector 51 is either one of the outputs 42 and 43. Thus, the memory 38 is address-controlled by this output signal 41.

The memory 39 is address-controlled by the output 48 from a third address counter 49 to which a coefficient read-out clock 50 is applied.

The convolution operation between the input signals and the coefficients is carried out through the circuit construction mentioned above.

The sampling point converting circuit may be constituted by a digital filter such as shown in FIG. 12A. Thus, this filter can possess both the filtering effect such as shown in FIG. 11 and the conversion function of sampling points.

FIG. 12B illustrates coefficient data stored in coefficient ROM 39 and contributes to the sampling point conversion operation. The solid line and dashed line waveform data represent input PCM signal data 35 and coefficient data 36 at a time $t=t_j$ and at the preceding and succeeding points on the time-base axis to be and to have been read out from the RAM 38 and ROM 39. With the sampling frequency $f_s$, zero data are added between adjacent PCM signal data on the time-base axis to thereby effect a doubling of the sampling frequency to $2f_s$. The resulting data (data 35+zero data) are multiplied by the coefficient data 36 ("o" data+" ● " data) in the multiplier 34 and the resulting products are added in the adder 32, whereby the PCM signal data at sampling point $p_j$ not included in the original sampling points, i.e., a sampling point converted PCM signal data is obtained. Since the products of PCM signal data marked "●" and coefficient data marked "o" are all zero, the ROM 39 need not store coefficient data marked "o". The PCM signal data at sampling point $P_{j+1}$ can be obtained through a procedure similar to that described above with the coefficient data 36 shifted by T. The coefficient data 36 are such that the cutoff frequency of the digital filter becomes $f_s/2$.

Figure 13A:
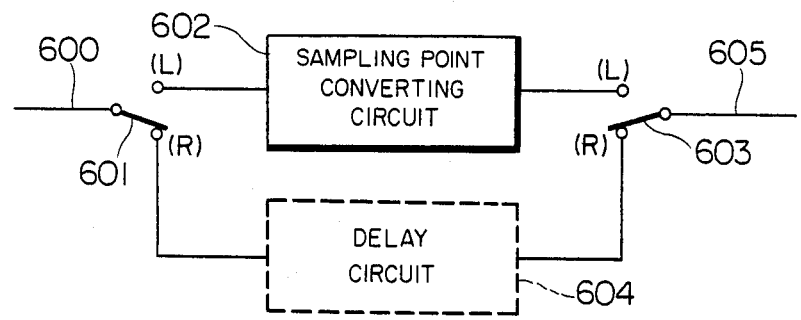
FIGS. 13A to 13C are diagrams showing signal selection means and its associated structure which may be used in the present invention and showing a signal delay operation.
Figure 13B:
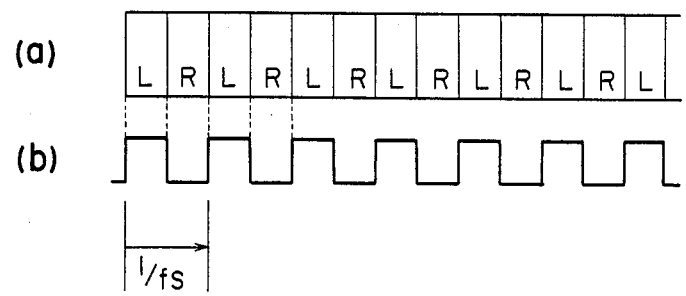
Figure 13C:
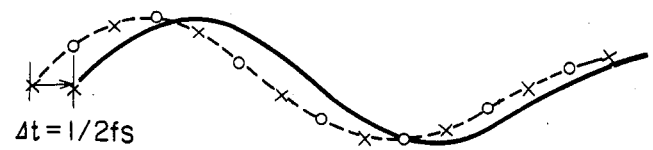

Reference will now be made to FIGS. 13A to 13C showing an example of the selection means and its associated circuit which may be used for the selection means referred to in the embodiments shown in FIGS. 4B, 4C and 6. Reference numeral 600 designates a series of PCM multi-bit digital signals including a plurality of groups of PCM multi-bit digital signals, each signal group being representative of one of a plurality of multi-channel analog signals. Here, two channel, L- and R-channel analog signal will be considered as an example, so that the signal 600 includes digital data as shown at (a) of FIG. 13B. A switch 601 is interlocked with another switch 603 and these switches 601 and 603 are driven by a switch control signal shown at (b) of FIG. 13B so that, for example, the L-channel multi-bit digital signal group of the signal series 600 is selected and supplied to the converting circuit 602 and the other signal group is bypassed to be combined with the output of the converting circuit 602, thereby producing a series of sampling point converted PCM digital signals 605. The switch control signal may be identical with the channel switch signal for the formation of the input PCM digital signal. Thus, the switches 601 and 603 constitute a signal path for bypassing the signal group which need not be sampling point converted. Further, reference numeral 604 designates a delay circuit and serves to compensate for a time delay which may be caused during the processing in the converting circuit 602. As exemplified in FIG. 13C, the dashed line waveform of sampling point converted data may be delayed by a time Δt so that the converted data are in the waveform shown by the solid line. Thus, if the digital filter constituting the converting circuit is not in such a structure as to compensate for such a time delay (for example, by means for adjusting the timing for reading out the data from the RAM and ROM), the delay circuit 604 is provided in the bypassing signal path between the switches 601 and 603.

Figure 14A:
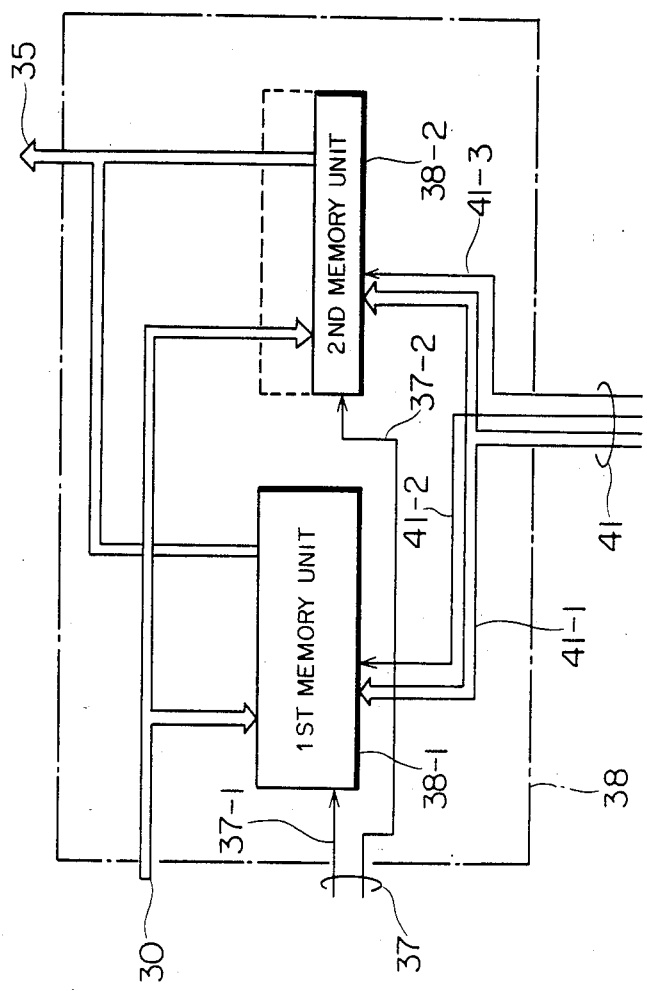
FIGS. 14A and 14B are diagrams showing another example of the structures of an input data storage RAM and a coefficient storage ROM in a sampling time converting circuit which may be used in the present invention.
Figure 14B:
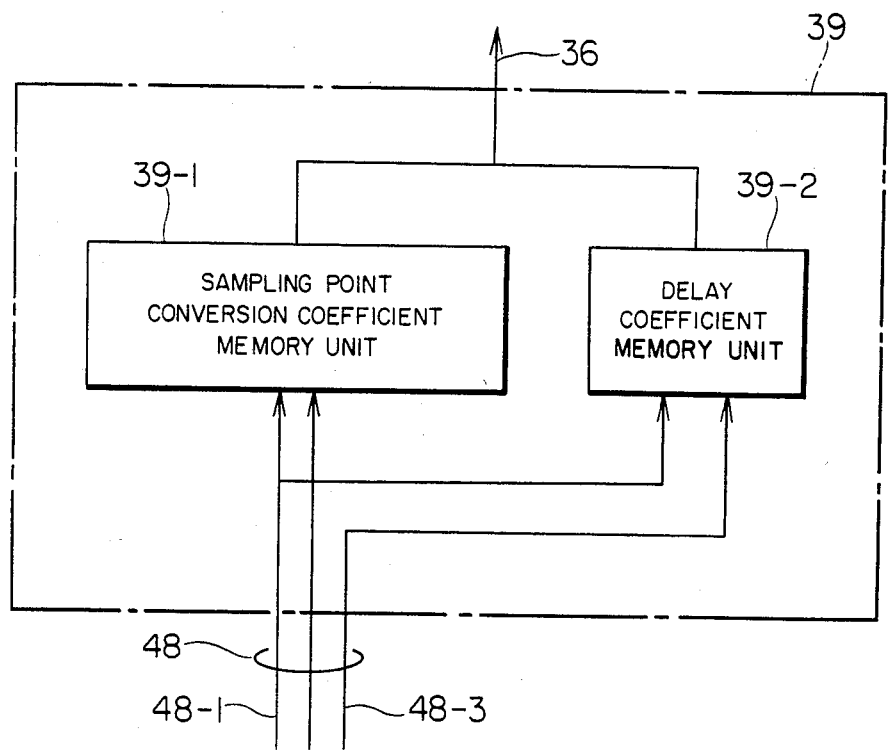

A structure for the sampling point converting circuit 602 having a function identical with the switches 601 and 603 and the delay circuit 604 is shown in FIGS. 14A and 14B.

In FIG. 14A, the RAM 38 includes a first memory unit 38-1 for storing PCM digital signal data (e.g., L-channel signal data) which need to be sampling point converted and a second memory unit 38-2 for storing the other PCM digital signal data (e.g., R-channel signal data). The memory capacity of the second memory unit may be one-half of that of the first memory unit. The memory control signal 37 includes control signal portions for controlling the writing operation of the first and second memory units 38-1 and 38-2. The selection output signal 41 includes address signal 41-1 for simultaneously selecting the memory units 38-1 and 38-2 and selection signals 41-2 and 41-3 for separately selecting them.

In FIG. 14B, the ROM 39 includes a memory unit 39-1 for storing sampling point conversion coefficient and another memory unit 39-2 for storing delay coefficients. The output 48 of the address counter 49 (FIG. 12A) includes coefficient address signal 48-1 to be applied to both of the memory units 39-1 and 39-2 and selection signals 48-2 and 48-3 for separately selecting the memory units 39-1 and 39-2.

Figure 14C:
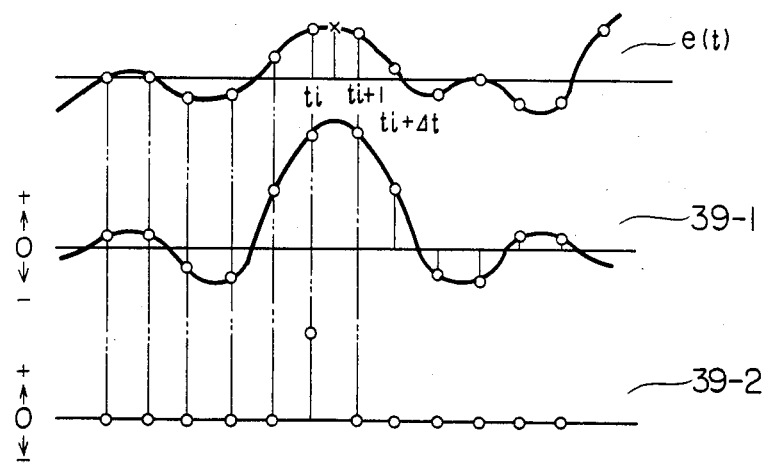
FIG. 14C is a diagram illustrating an operation of the sampling time converting circuit including the structure shown in FIGS. 14A and 14B.

FIG. 14C is a diagram for illustrating the manner of generation of the sampling point conversion and delayed data by the structure including the RAM 38 and the ROM 39 shown in FIGS. 14A and 14B. The waveform e(t) designates an L- or R-channel PCM digital signal data.

Further, although in the above mentioned embodiments, the sampling time conversion is carried out by converting or deviating the sampling points by one-half of the sampling period for producing alternate or simultaneous sampling data, it is also possible with the present invention to deviate a predetermined time other than the above-mentioned one-half of the sampling period, thereby attaining correction of errors in two-channel signals on the time-base axis.

The operation of the signal conversion apparatus of doubling the sampling frequency to pass the base band components of the signals and of converting the sampling points will be explained referring to FIG. 15. FIG. 15 shows at a and b the timing of alternate sampling data of two channels, at c and d the data resulting from the doubling of the above data and the conversion of the sampling points thereof.

Namely, the frequency doubling is made by producing from the signals composed of A, B, C, D, ... the components at the points $A_1$ and $A_3$, for example. In the similar manner, the components at the points $a_2$ and $a_4$, for example, are produced from the signals composed of a, b, c, d, e, ... Thus, the signals such as shown at c and d are produced. The signals shown at c and d are different in the sampling points by one half of the period $\frac{1}{2}/f_s$, i.e., $\frac{1}{2}f_s$, which implies the conversion of sampling points. Although, in FIGS. 14A to 14C, the sampling point conversion has been explained about the alternate sampling data, the sampling frequency conversion and the sampling point conversion are also possible with respect to the simultaneous sampling data by changing the production points.

The sampling frequency multiplication higher than doubling may be made in the similar manner.

Figure 16:
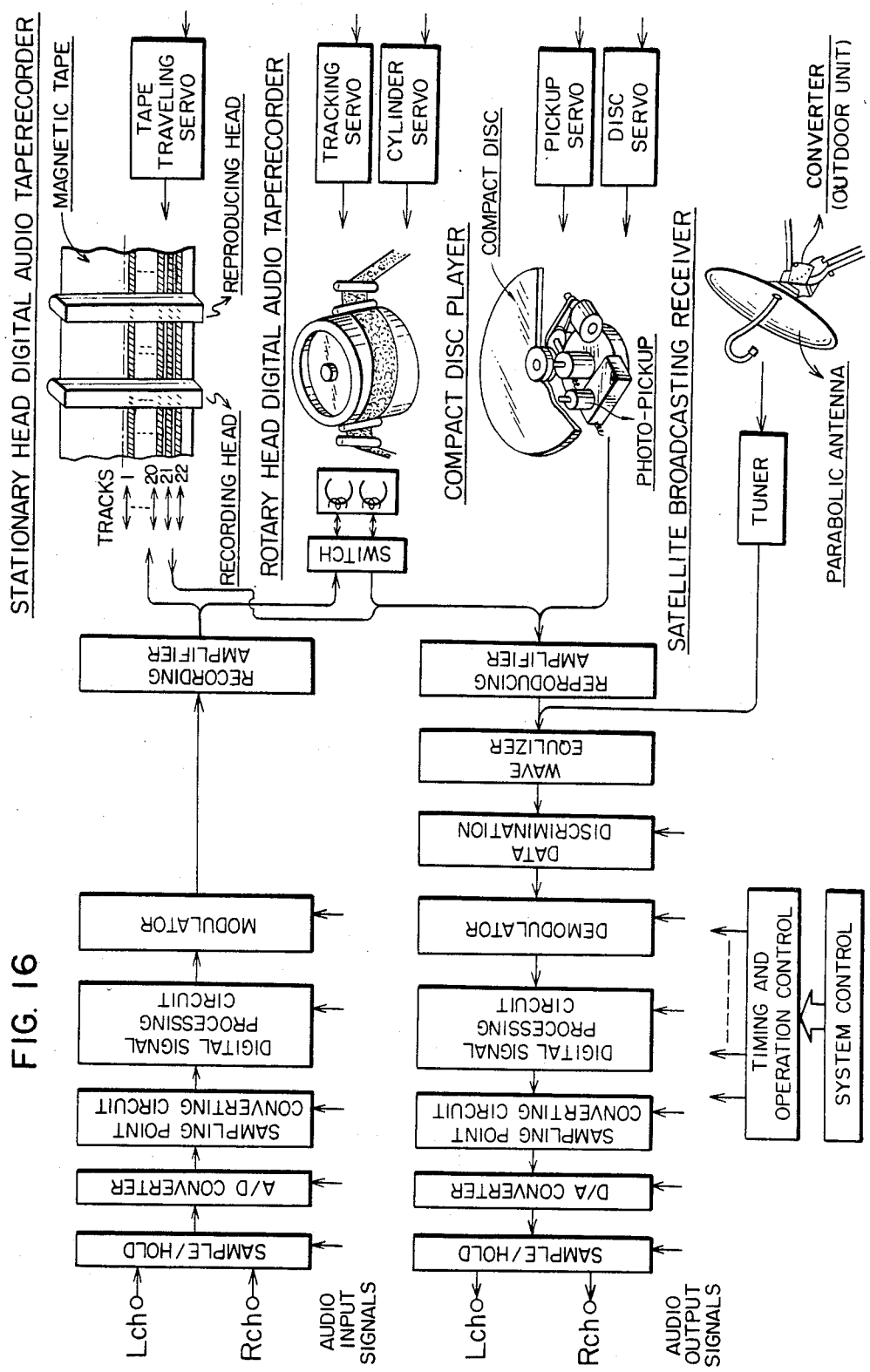
FIG. 16 is a general diagram showing examples of PCM signal processing systems to which the present invention may be applied.

FIG. 16 is a general diagram of a PCM signal processing systems to which PCM signal conversion apparatuses are applied. The PCM signal processing systems shown in the drawing are a stationary head digital audio taperecorder (DAT), a rotary head DAT, a compact disc (CD) player and a satellite broadcasting receiver.

Some of the advantages provided by the present invention are as follows:

In a digital audio system having two or more channels, simultaneous sampling data can be converted to alternate sampling data or vice versa, which makes possible communication between digital audio systems dealing with different sampling point PCM signal data and the derivation of the simultaneous sampling data from an alternate sampling data; and as described above, a PCM reproducing apparatus or a PCM recording and reproducing apparatus commonly uses a single digital-to-analog converter and a single analog-to-digital converter for multi-channel signals, without using two or more converters for conversion of each channel signal for the purposes of realizing low cost, compactness, electricity saving, etc. In this case, with respect to two-channel PCM signals, for example, which have been generated through simultaneous sampling, sampling time conversion has heretofore been effected by an analog system being necessarily accompanied with signal distorsion. However, the PCM signal conversion apparatus of the present invention is capable of sampling point conversion, owing to the digital techniques, of simultaneous sampling data without suffering from such signal distorsion encountered with the analog system.

We claim:

1. An apparatus for converting a multi-channel analog signal to a PCM signal, said multichannel analog signal including a plurality of analog signal portions on separate channels, the apparatus comprising:

means for converting all of said analog signal portions to multi-bit digital signals through sampling and quantization, each of said digital signals being representative of the amplitude of different one of said analog signal portions at a sampling point during said sampling; and translation means coupled to said converting means for producing from at least those of said multi-bit digital signals which correspond to at least one of said analog signal portions substitutional multi-bit digital signals representative of the amplitudes of said at least one analog signal portion at sampling points different from those at which said at least one analog signal portion was sampled to provide said those multi-bit digital signals and substituting said substitutional digital signals for a part of said those digital signals corresponding to said at least one analog signal portion.

2. An apparatus according to claim 1, in which said converting means includes a plurality of converters, the number of said converters being the same as that of said channels so that each of said analog signal portions is converted to a group of multi-bit digital signals in its associated one of said converters, said translation means is arranged to receive the output of that one of said converters which deals with said at least one analog signal portion, and the apparatus further comprises means coupled to receive the output of said translation means and the outputs of said converters except said that converter for multiplexing them to produce said PCM signal.

3. An apparatus according to claim 1, in which said converting means includes a plurality of converters, the number of said converters being the same as that of said channels so that each of said analog signal portions is converted to a group of multi-bit digital signals in its associated one of said converters, the apparatus further comprises means coupled to said converters for multiplexing the outputs of said converters to produce a series of multi-bit digital signals and means for selecting from said series of digital signals a group of multi-bit digital signals being identical with said those digital signals, and said selecting means is connected between said multiplexing means and said translation means.

4. An apparatus according to claim 1, in which said converting means includes a single converter and multiplexing means for said conversion to said multi-bit digital signals and for producing therefrom a series of multi-bit digital signals, and the apparatus further comprises means for selecting from said series of multi-bit digital signals said those multi-bit digital signals, said selecting means being connected between said converting means and said translation means.

5. An apparatus according to claim 1, in which said translation means is constituted by a digital filter.

6. An apparatus for converting a PCM signal to a multi-channel analog signal including a plurality of analog signal portions on separate channels, said PCM signal containing a series of multi-bit digital signals representative of said multi-channel analog signal, the apparatus comprising:

translation means for producing from at least those multi-bit digital signals in said series of multi-bit digital signals which correspond to at least one of said analog signal portions substitutional multi-bit digital signals representative of the amplitudes of said at least one analog signal portion at sampling points different from those at which said at least one analog signal portion was sampled to provide said those multi-bit digital signals and substituting said substitutional digital signals for a part of said those digital signals corresponding to said at least one analog signal portion; and means arranged for receiving the remaining multi-bit digital signals and coupled to said translation means for thereby converting said remaining multi-bit digital signals and the output of said translation means to said analog signal portions on separate channels.

7. An apparatus according to claim 6, further comprising means for selecting from said series of multi-bit digital signals said those mutli-bit digital signals, the output of said selecting means being coupled to said translation means for the production of said substitutional multi-bit digital signals in said translation means, said converting means includes a single converter for receiving the output of said translation means and means connected with said single converter for separating its output into said analog signal portions on different channels.

8. An apparatus according to claim 6, in which the apparatus further comprises means for separating said series of multi-bit digital signals into groups of multi-bit digital signals, each of said groups being representative of different one of said analog signal portions, said converting means includes a plurality of converters, the number of said converters being the same as that of said channels so that each of said groups of multi-bit digital signals is converted to an analog signal portion in its associated one of said converters, said translation means being connected between said separating means and that one of said converters which deals with said those multi-bit digital signals.

9. An apparatus according to claim 6, in which said translation means is constituted by a digital filter.

* * * * *